US005973629A

United States Patent [19]

Fujii

[11] Patent Number: 5,973,629

[45] Date of Patent: Oct. 26, 1999

[54] DIFFERENTIAL PCM SYSTEM WITH FRAME WORD LENGTH RESPONSIVE TO MAGNITUDE

[75] Inventor: Shigeki Fujii, Hamamatsu, Japan

[73] Assignee: Yamaha Corporation, Hamamatsu, Japan

[21] Appl. No.: 08/978,070

[22] Filed: Nov. 25, 1997

[30] Foreign Application Priority Data

Dec. 12, 1996 [JP] Japan .................................... 8-332339

[51] Int. Cl.[6] ........................................................ H03M 3/04

[52] U.S. Cl. ............................ 341/76; 341/143; 375/246

[58] Field of Search ............................... 341/76, 77, 143; 375/243–251

[56] References Cited

U.S. PATENT DOCUMENTS

| | | | |
|---|---|---|---|
| 4,646,148 | 2/1987 | Lienard et al. | 375/122 |
| 5,128,963 | 7/1992 | Akagiri | 375/25 |
| 5,365,553 | 11/1994 | Veldhuis et al. | 375/122 |

*Primary Examiner*—Howard L. Williams
*Attorney, Agent, or Firm*—Pillsbury Madison & Sutro LLP

[57] ABSTRACT

A compressive encoding-decoding system is provided specifically for the realization of the lossless encoding system having a good efficiency. Herein, input signals are subjected to analog-to-digital conversion to generate a series of linear PCM data. Then, the system generates a series of difference value data, each representing a difference between adjacent samples of the linear PCM data, which are then combined with respect to each frame. Requantization is performed on the difference value data on the basis of a word length. In a first mode, the word length is determined to coincide with a minimum number of bits which are required to represent the difference value data having a maximum absolute value within the difference value data contained in each frame. In a second mode corresponding to word extension, a value of 'L' is determined as a unit of bits for partitioning in such a way that an overall length of each frame becomes the shortest when each of the difference value data contained in each frame is subjected to partitioning starting from a LSB thereof by every L bits. In addition, a single bit representing as to whether or not each portion of L bits within each difference value data is a last portion (or last word) is added as a flag to the word length. Herein, one of the modes which provides a shorter length for the frame is selected, so the system produces data of each frame (i.e., bit stream) containing the difference value data requantized based on the word length, and information of the word length as well as information of the selected mode.

13 Claims, 8 Drawing Sheets

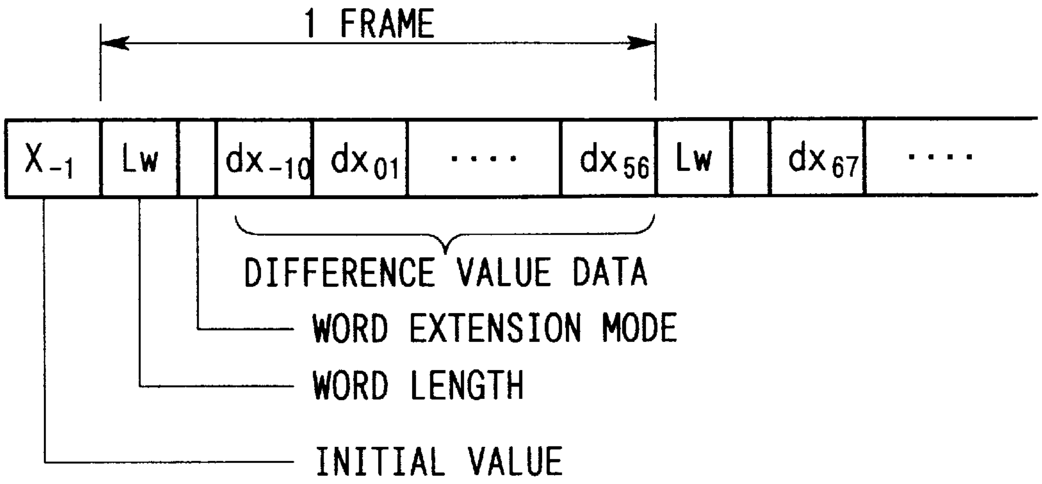
FIG.8
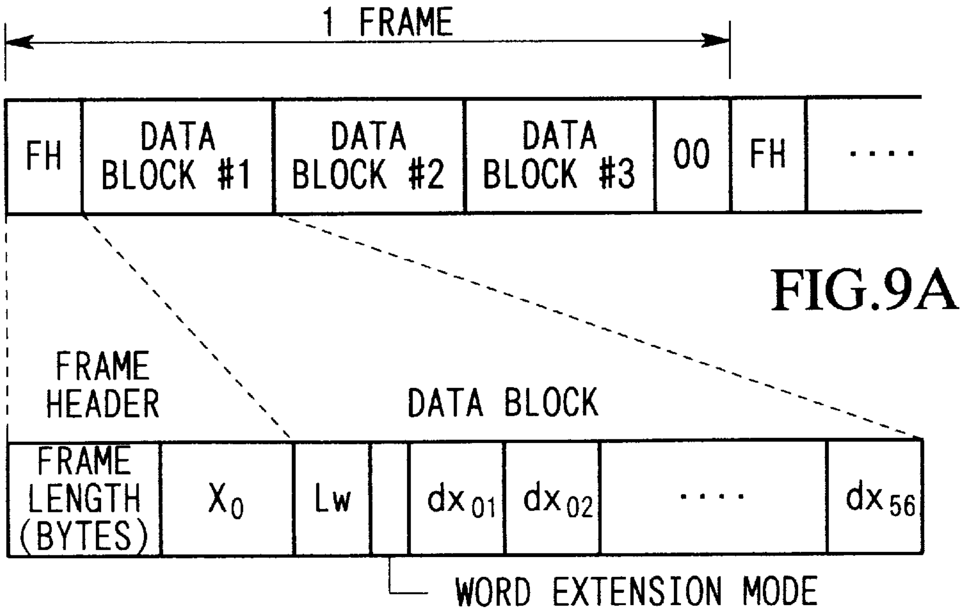
FIG.9A
FIG.9B

DIFFERENTIAL PCM SYSTEM WITH FRAME WORD LENGTH RESPONSIVE TO MAGNITUDE

BACKGROUND OF THE INVENTION

1. Field of the Invention

This invention relates to lossless compressive encoding and decoding systems which are capable of accurately regenerating original information which are subjected to compression and expansion, and particularly to compressive encoding and decoding systems which are suited to lossless compressive encoding of audio signals. This application is based on patent application No. Hei 8-332339 filed in Japan, the content of which is incorporated herein by reference.

2. Prior Art

Conventional computer technolgy frequently uses the lossless compressive encoding for compression of data. As the compressive encoding method, it is possible to employ a variety of methods such as the Haffmann coding method and run-length coding method. Those methods use the apperance probability of the bit pattern as well as the correlation. For this reason, an effect of compression is not so high when the compressive encoding method is applied to the bit pattern which, like audio PCM data, is meaningless in a sense of statics.

By the way, the ADPCM method (where 'ADPCM' stands for 'Adaptive Differential Pulse Code Modulation') is kown as the data compression method of audio signals. Using high correlation between adjacent sampling values of audio signals, the above method performs quantization on a difference between an input signal and a predictive value so as to reduce a bit rate.

The aforementioned ADPCM method is designed to perform requantization of a difference value by using 4 bits and 16 levels, for example. In the requantization, the method changes quantization step size thereof in an adaptive manner to follow increments and decrements of the difference value. For this reason, some of the difference values may cause occurrence of a quantization error. In other words, the ADPCM method does not work as the complete lossless coding. In general, losses are classified into two kinds of losses, i.e., a loss corresponding to overload distortion and a loss corresponding to granular distortion. Herein, the loss of the overload distortion occurs when the difference value becomes so big to exceed a range of quantization, while the loss of the granular distortion occurs when the difference value cannot be represented by multiples of the quantization step size multiplied by an integral number.

SUMMARY OF THE INVENTION

It is an object of the invention to provide a compressive encoding and decoding system (simply referred to as "compressive encoding-decoding system") which is capable of realizing a lossless encoding process with a good efficient by determining an optimum number of bits for encoding in response to an input signal.

A compressive encoding-decoding system of this invention is actualized by a compressive encoder and a compressive decoder.

In the compressive encoder, input signals are subjected to analog-to-digital conversion based on the non-linear quantization method such as the $\mu$-law -law method and A-law method to generate a series of linear PCM data. Then, the compressive encoder generates a series of difference value data, each representing a difference between adjacent samples of the linear PCM data, which are then combined with respect to each frame. Requantization is performed on the difference value data on the basis of a word length. In a first mode, the word length is determined to coincide with a minimum number of bits which are required to represent the difference value data having a maximum absolute value within the difference value data contained in each frame. In a second mode corresponding to word extension, a value of 'L' is determined as a unit of bits for partitioning in such a way that an overall length of each frame becomes the shortest when each of the difference value data contained in each frame is subjected to partitioning starting from a LSB thereof by every L bits. In addition, a single bit representing as to whether or not each portion of L bits within each difference value data is a last portion (or last word) for each difference value data is added as a flag to the word length. Herein, one of the modes which provides a shorter length for the frame is selected, so the compressive encoder produces data of each frame (i.e., bit stream) containing the difference value data requantized based on the word length, and information of the word length as well as information of the selected mode.

In the compressive decoder, the bit stream is subjected to decomposition, wherein the difference value data are reproduced based on the word length. Then, the linear PCM data are reproduced and are subjected to digital-to-analog conversion to produce output signals of the compressive decoder which correspond to the input signals of the compressive encoder.

BRIEF DESCRIPTION OF THE DRAWINGS

These and other objects of the subject invention will become more fully apparent as the following description is read in light of the attached drawings wherein:

FIG. 3C shows a format for a series of difference value data in an event that a word extension mode is ON;

FIG. 8 shows a modified example of a format for a bit stream;

FIG. 9A shows a further modified example of a format for a bit stream; and

FIG. 9B shows a specific configuration of a frame shown in FIG. 9A.

DESCRIPTION OF THE PREFERRED EMBODIMENT

Now, a description will be given with respect to a compressive encoding-decoding system in accordance with an embodiment of the invention with reference to the drawings.

Figure 1:
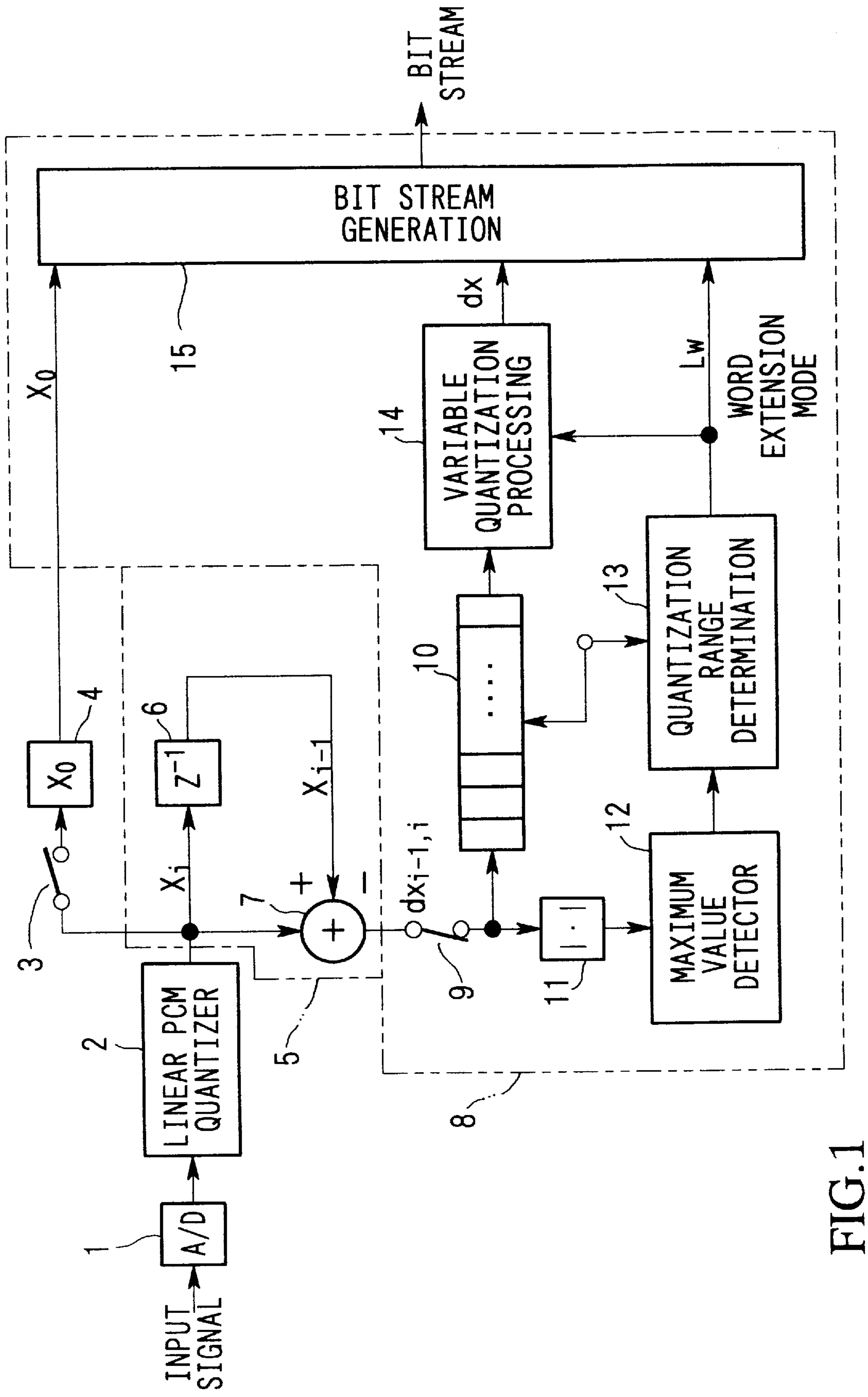
FIG. 1 is a block diagram showing a configuration of a compressive encoder which is used for a compressive encoding-decoding system in accordance with an embodiment of the invention.

FIG. 1 is a block diagram showing a configuration of a compressive encoder which is applicable to the invention. The compressive encoder is located in a transmitting station when the invention is applied to a communications system. Or, it is possible to apply the invention to an audio recording system using an audio recorder. In that case, the compressive encoder is located within the audio recorder or prior to the audio recorder.

Incidentally, the compressive encoder uses time-series N samples of input audio signals as a unit of encoding (where 'N' is an integer arbitrarily selected). Hereinafter, the unit of encoding is called "1 frame".

In FIG. 1, an analog-to-digital converter (simply, A/D converter) 1 converts input signals to digital data in accordance with the non-linear quantization method such as the $\mu$-law method and A-law method, for example. Then, a linear PCM quantizer 2 converts the digital data to a series of linear PCM data 'xi'(where i=0, 1, . . . , N−1). The linear PCM data xi are subjected to sampling by constant intervals of time (called "frame intervals") by a sampling section 3. Incidentally, the sampling section 3 is illustrated as an equivalent circuit thereof (i.e., a switch) in FIG. 1. Then, a value of sampling data is stored as an initial value in an initial value buffer 4. The switch of the sampling section 3 is normally turned OFF. However, the switch is substantially turned ON at a time when first sample data x0 in 1 frame is supplied from the linear PCM quantizer 2.

The linear PCM data xi are supplied to a difference value generator 5 as well. In the difference value generator 5, the linear PCM data xi are delayed by one sampling period by a delay circuit 6. Then, a subtractor 7 subtracts an output of the delay circuit 6 from the linear PCM data xi to produce a series of difference value data "dxi−1,i" (where i=1, 2, . . . , N−1). The difference data dxi−1,i are supplied to a sampling section 9 of a requantization section 8. Herein, the sampling section 9 is illustrated as an equivalent circuit thereof (i.e., a switch). The sampling section 9 inputs the series of difference data dxi−1,i, which are stored in a difference value buffer 10. The difference value buffer 10 has a capability to store (N−1) samples of the difference value data which correspond to 1 frame of data. Incidentally, the sampling section 9 works exclusively with respect to the aforementioned sampling section 3. An absolute value calculating section 11 converts the difference data dxi−1,i to absolute values, which are forwarded to a maximum value detector 12. The maximum value detector 12 detects a maximum value from the absolute values corresponding to the (N−1) samples of the difference value data dxi−1,i. On the basis of the maximum value detected by the maximum value detector 12 and stored data of the difference value buffer 10, a quantization range determination section 13 produces a word length $L_W$ as well as information regarding a word extension mode. Herein, the quantization range determination section 13 sets the word length $L_W$ which is optimum to each frame. Outputs of the quantization range determination section 13 are delivered to a variable quantization processing section 14 and a bit stream generation section 15. Based on the word length and word extension mode information, the variable quantization processing section 14 performs a variable-length quantization process on the difference value data dxi−1,i stored in the difference value buffer 10. The bit stream generation section 15 receives the initial value x0 and the difference value dxi−1,i output from the variable quantization processing section 14 as well as the word length $L_W$ and word extension mode information output from the quantization range determination section 13. So, the bit stream generation section 15 assembles them together to provide frame data in a form of a bit stream.

Next, a description will be given with respect to operation of the compressive encoder of FIG. 1 described above.

The compressive encoder has two modes, i.e., a first mode which is not accompanied with word extension and a second mode which is accompanied with word extension. So, an optimum one is selected from the two modes with respect to each frame.

(1) First Mode (Without Word Extension)

Now, the content of the first mode will be explained in conjunction with FIG. 2.

Figure 2:
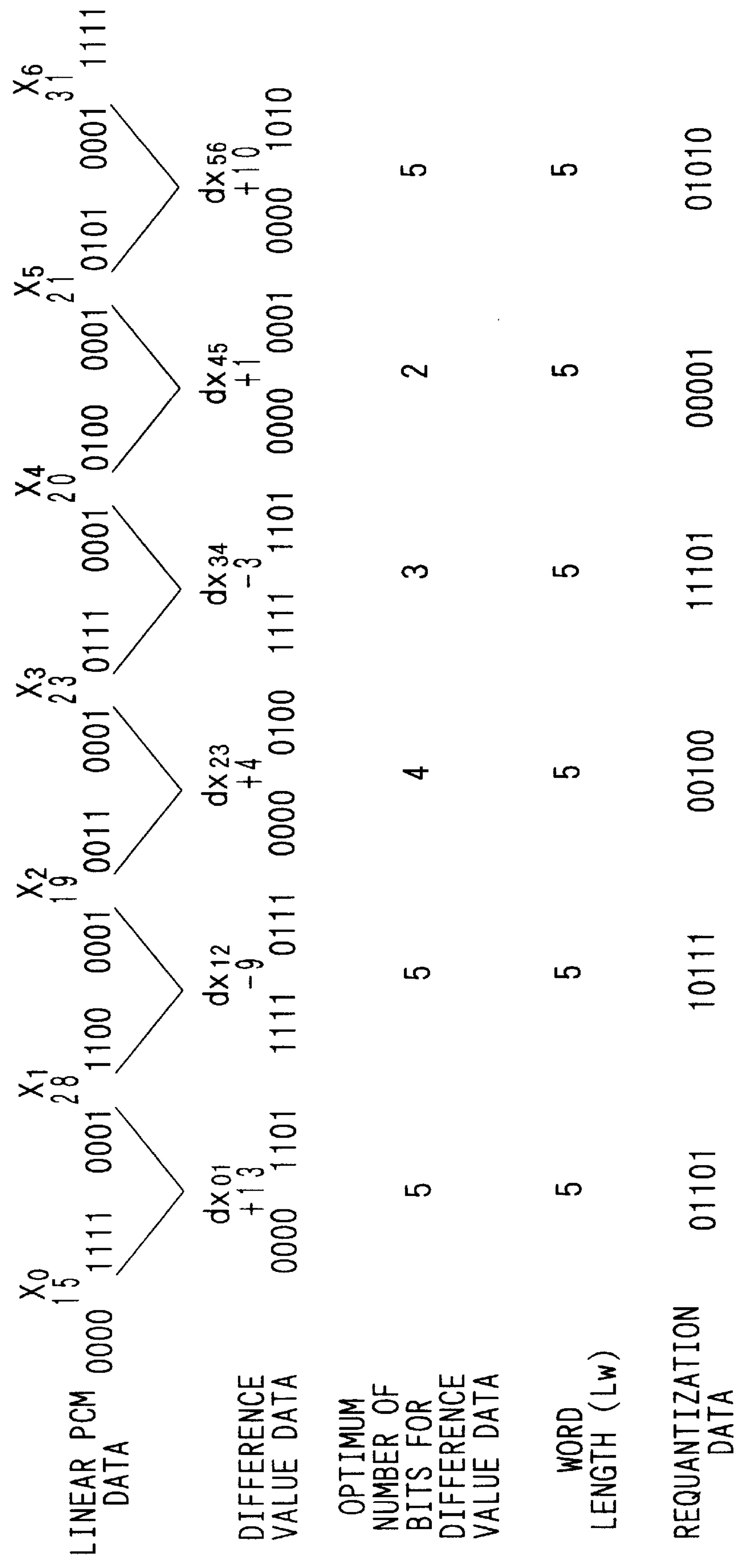
FIG. 2 shows binary codes and numbers of data used in the compressive encoder of FIG. 1 in connection with a first mode without word extension.

Numbers and symbols used in FIG. 2 are set based on a precondition that a number of samples contained in one frame is seven (i.e., N=7); seven linear PCM data x0, x1, x2, . . . , x6 corresponding to one frame are each represented by data of 8 bits and are also represented in decimal notation by "15", "28", "19", "23", "20", "21" and "31" respectively. Herein, difference value data dx01 is calculated between the linear PCM data x0 and x1; difference value data dx12 is calculated between x1 and x2; . . . ; and difference value data dx56 is calculated between x5 and x6. In this case, the difference value data dx01, dx12, dx23, . . . , dx56 are represented in decimal notation by "+13", "−9", "+4", "−3", "+1" and "+10" respectively. Incidentally, FIG. 2 shows numbers represented by 8 bits and two's complement. Now, a dynamic range is calculated with respect to the difference value data. Among the difference value data, a maximum absolute value is dx01=+13. To represent it, it is possible to ignore high-order three bits from 8 bits even if a sign bit is included. That is, the difference value data dx01=+13 can be represented by a binary code of "01101", which is 5-bit data. In other words, the dynamic range of the difference value data can be represented using 5 bits. For this reason, the 5 bits are determined as a number of bits corresponding to the word length $L_W$. So, the first mode is designed not to consider optimum numbers of bits for the difference value data other than dx01. In the first mode, all of the difference value data dx01, dx12, . . . , dx56 are encoded using the word length of 5 bits.

Figure 3A:
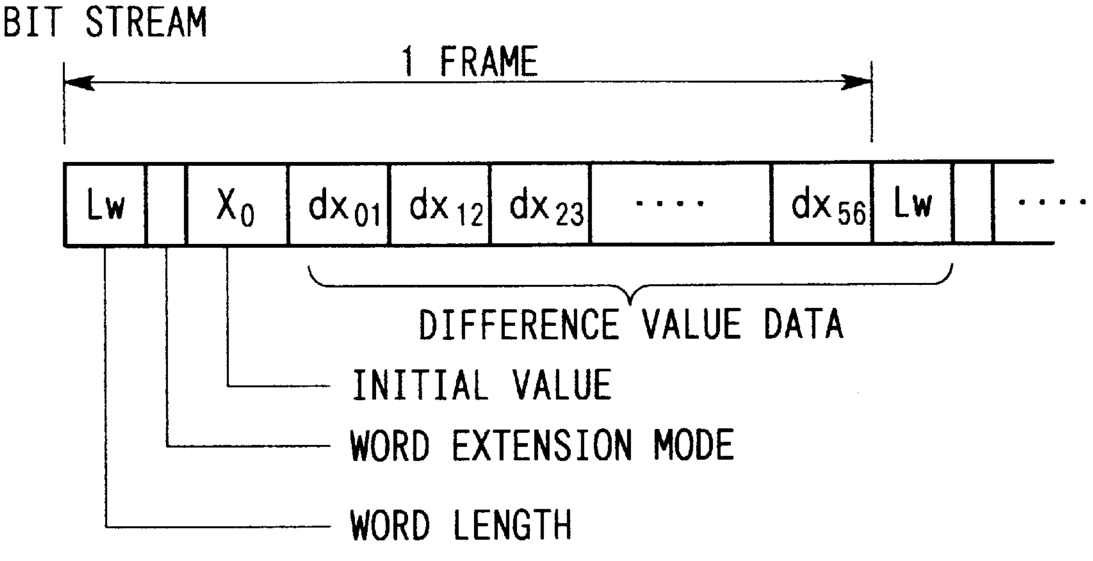
FIG. 3A shows a format for a bit stream.
Figure 3B:
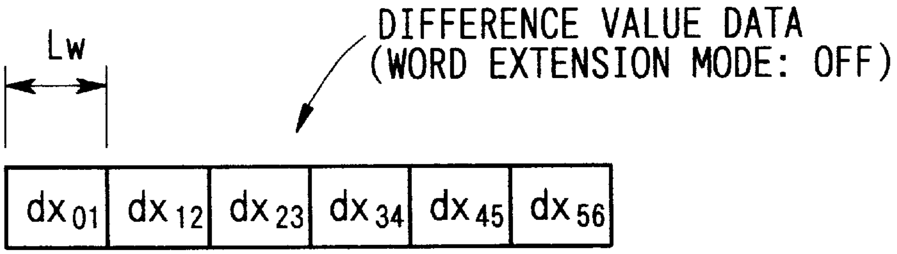
FIG. 3B shows a format for a series of difference value data in an event that a word extension mode is OFF.
Figure 3C:
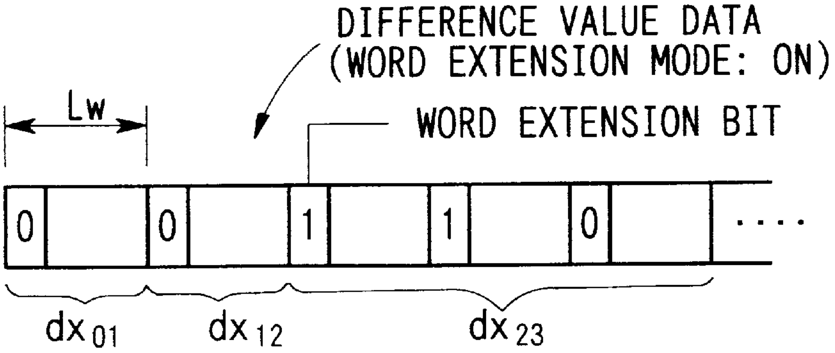

FIGS. 3A, 3B and 3C show formats of data used in FIG. 1.

FIG. 3A shows a format of a bit stream, wherein one frame is constructed by the word length $L_W$, word extension mode, initial value x0 and difference value data dx01, dx12, . . . , dx56. In the first mode where the word extension mode is OFF, the difference value data are shown in accordance with a format of FIG. 3B, wherein each difference value data is represented by a constant word length $L_W$ (i.e., 5 bits). By the way, there is no possibility that "0 bit" is used for the word length $L_W$. Herein, the word length is represented by combinations of bits, a maximum number of which may be eight. That is, there exist eight kinds of word lengths. In other words, all the word lengths can be represented by data of 3 bits (which is at "001", "010", . . . , "111" and "000"). Incidentally, the word extension mode can be represented by one bit, whose digit is at '1' when the word extension mode is ON while '0' when OFF. In short, a bit stream of FIG. 3A is constructed by the elements as follows:

| | |
|---|---|
| word length $L_W$ | 3 bits |
| word extension mode | 1 bits |
| initial value x0 | 8 bits |
| series of difference value data | 30 bits (i.e., 5 bits × 6) |
| total number of bits | 42 bits |

Incidentally, the "original" linear PCM data are represented as follows:

8 bits×7 samples =56 bits

So, the first mode realizes data compression at a rate of 0.75 as compared to the original linear PCM data whose bits are shown in FIG. 2.

(2) Second Mode (With Word Extension)

The content of the second mode will be explained in conjunction with FIG. 4.

Figure 4:
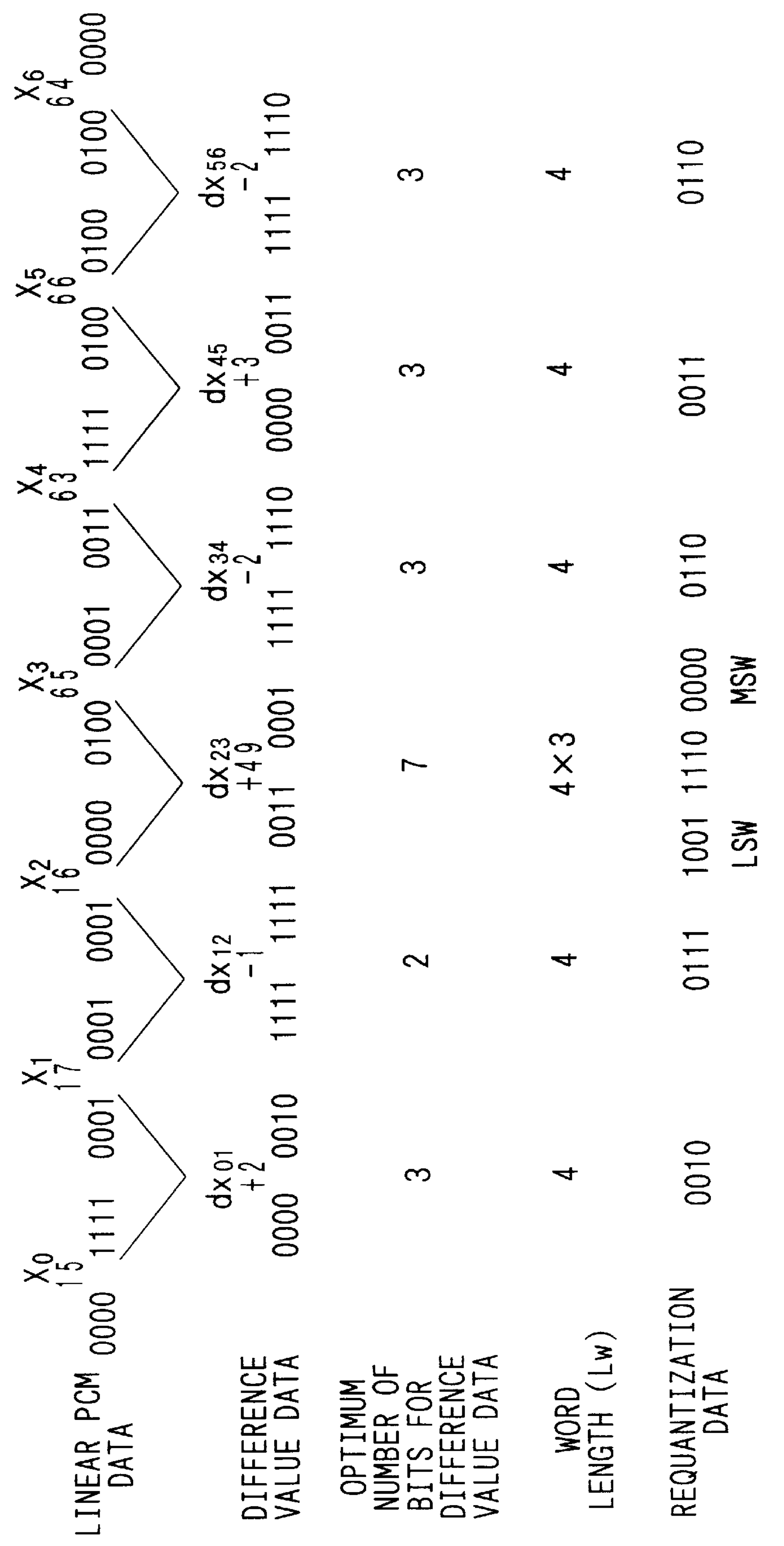
FIG. 4 shows binary codes and numbers of data used in the compressive encoder of FIG. 1 in connection with a second mode with word extension.

Numbers and symbols of FIG. 4 are set in such a way that a number of samples contained in one frame is set at '7' (i.e., N=7); seven linear PCM data x0, x1, . . . , x6 are each represented by data of 8 bits and are represented in decimal notation by "15", "17", "16", "65", "63", "66" and "64" respectively. So, difference value data dx01, dx12, . . . , dx56 are represented by "+2", "−1", "+49", "−2", "+3" and "−2" respectively. Among the values of the difference value data, the difference value data dx23 has a very large value of "+49" which is the largest as compared to the other difference value data. Herein, it is possible to set a word length $L_W$ at '7' in accordance with the difference value data dx23 corresponding to "+49". However, if the word length Lw of the second mode is set at a fixed number like the aforementioned first embodiment, the other difference value data should have a number of useless bits. Due to such a number of useless bits, it is not expected to provide a high compression effect in the above frame.

The other difference value data, excluding the difference value data dx23, have optimum numbers of bits, all of which are not greater than "3". The difference value data dx23 can be partitioned, from the least significant bit, into three portions (or words) each corresponding to 3 bits, as follows:

(0)00/110/000 (where "(0)"is an additional bit for the partitioning) The three portions are sequentially extracted from the low-order side of the difference value data dx23 to provided a reverse-order form of the difference value data dx23 (i.e., "001/110/000"). Then, a single bit is added at a top of each portion to indicate as to whether each portion is followed by another portion. Thus, it is possible to create 12-bit data as follows:

1001/1110/0000

In the above, a digit 0 is used for the word extension bit to indicate a last portion (or last word) while a digit 1 is used for the word extension bit to indicate a non-last portion (or non-last word) which is followed by another portion.

Similar processing is performed with respect to the other difference value data dx01, dx12, dx34, dx45 and dx56 respectively, wherein a digit 0 is added at a top of each difference value data as the word extension bit. Thus, it is possible to create requantization data shown in FIG. 4 with respect to the difference value data respectively. As for the difference value data dx01, for example, low-order three bits (i.e., "010") are extracted and added with a word extension bit of "0" to create requantization data of "0010". That is, the requantization has a word length $L_W$=4.

As described above, the second mode is designed to add a word extension bit at a top of each word. FIG. 3C shows a format for the difference value data in the second mode.

As for the second mode, it is possible to calculate a total number of bits contained in one frame, as follows:

| | |
|---|---|
| word length $L_W$ | 3 bits |
| word extension mode | 1 bit |
| initial value x0 | 8 bits |
| series of difference value data | 32 bits (i.e., 4 bits × 8) |
| total number of bits | 44 bits |

So, the second mode realizes data compression at a rate of 0.79 as compared to the original linear PCM data shown in FIG. 4.

Next, a description will be given with respect to a method to determine a mode for encoding as well as a method to determine an optimum word length.

Figure 5:
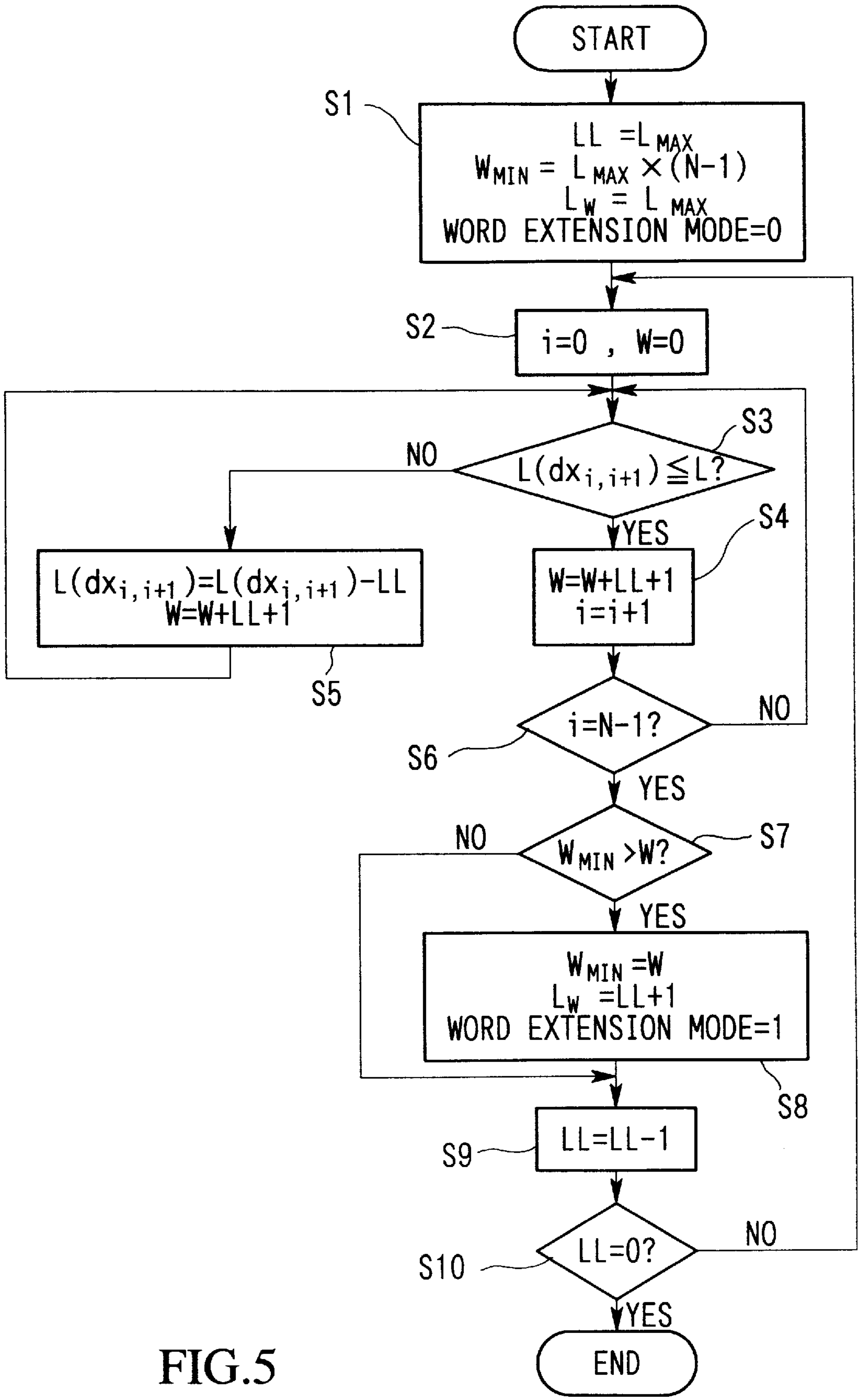
FIG. 5 is a flowchart showing an algorithm which is performed for determination of a mode as well as determination of an optimum word length.

FIG. 5 is a flowchart showing an algorithm performed by the aforementioned quantization range determination section 13 with regard to determination of the mode and word length.

The algorithm uses a variety of variables, which will be explained as follows:

LL: a variable used to renew a word length in order to perform determination of the word length $L_W$ from its maximum value, wherein initial value of LL is represented by $L_{MAX}$ while initial value for the word length $L_W$ is represented by $L_{MAX}$ as well.

$L_{MAX}$: a number of bits of the maximum difference value data detected by the maximum value detector 12; in case of FIG. 2, it is equal to "5" while in case of FIG. 4, it is equal to "7".

$W_{MIN}$: a variable used to renew a minimum value for an overall length of a series of difference value data contained in one frame, wherein initial value thereof is represented by $L_{MAX}$×(N−1), which is at "30" in case of FIG. 2 while "42" in case of FIG. 4 because of N=7.

W: a variable used to calculate a length for a series of difference value data contained in one frame by accumulative addition, wherein initial value thereof is zero.

Next, an outline of the algorithm will be described below.

In step S1, the system calculates an overall length ($W_{MIN}$) of a series of difference value data which are subjected to encoding of the first mode (without word extension). Herein, the overall length is calculated by a mathematical expression of $L_{MAX}$×(N−1), where $L_{MAX}$ denotes a maximum number of bits of the difference data which have been already detected while (N−1) denotes a number of words. If an overall length calculated for the series of difference value data which are subjected to encoding of the second mode (with word extension) is shorter than the overall length calculated for the first mode, it is necessary to perform encoding of the second mode rather than encoding of the first mode. So, steps S2 to S10 are provided to make confirmation whether to perform encoding of the first mode or second mode. Specifically, the word length (LL) is subjected to reduction from $L_{MAX}$ by one bit in step S9, so that confirmation is made for an overall length (W) of the series of difference value data which are subjected to encoding of the second mode where each word is partitioned by LL. During the process of the confirmation, when the overall length W becomes shorter than the overall length $W_{MIN}$ of the first mode, '1' is set to the word extension mode in step S8. Thereafter, the system will calculate an optimum word length $L_W$ on the basis of the word length LL where the overall length W becomes the shortest.

Next, the content of the flowchart will be explained with respect to a concrete example.

First, the aforementioned variables LL, $W_{MIN}$ and $L_W$ are subjected to initial setting, while '0' is set to the word extension mode in step S1. Then, both of variables i and W are set at '0' in step S2, so processes of steps S3 to S6 are repeated by changing the variable i from '0' to 'N−1'. Specifically, if an optimum word length of difference value data dxi,i+1 is equal to or less than LL, the system proceeds to step S4 from step S3, wherein the variable i is renewed by an increment of '1' while accumulative addition is performed in such a way that "LL+1" is added to "W" to renew W. The accumulative addition of the step S4 is provided to calculate an overall length for a series of difference value data in the second mode, wherein '1' is a number of an additional bit for the word extension. On the other hand, if the optimum word length of the difference value data dxi,i+1 is greater than LL, the system proceeds to step S5 from step S3, wherein LL is subtracted from the optimum word length L(dxi,i+1), while accumulative addition is performed in such a way that "LL+1" is added to W to renew W. Then, the aforementioned steps are repeated.

When the accumulative addition of W completes with respect to all of the difference value data contained in one frame, the system proceeds to step S7 wherein a comparison is made between $W_{MIN}$ and W. If W is smaller than $W_{MIN}$, the system proceeds to step S8 wherein $W_{MIN}$ is stored as W; "LL+1" is stored as $L_W$; and '1' is set to the word extension mode. On the other hand, if W is equal to or greater than $W_{MIN}$, the system does nothing. Then, the system proceeds to step S9 to decrease LL by '1'. Thus, the aforementioned steps are repeated until LL becomes zero (see step S10).

As a result of the execution of the algorithm of FIG. 5, the system determines the word extension mode and word length which make the length of one frame shortest.

In case of FIG. 2, for example, '30' is given as an initial value of $W_{MIN}$, so W=36, 45, 40, 42, 48 when LL=5, 4, 3, 2, 1 respectively. Herein, each value of W has a relationship of $W_{MIN}$<W, so the system makes determination according to the algorithm such that '5' is set to the word length $L_W$ and '0' is set to the word extension mode.

In case of FIG. 4, '42' is given as an initial value of $W_{MIN}$, so W=48, 49, 42, 35, 32, 39, 42 when LL=7, 6, 5, 4, 3, 2, 1 respectively. Herein, a final value of $W_{MIN}$ is '32', so the system makes determination such that '4' is set to the word length $L_W$ and '1' is set to the word extension mode.

Figure 6:
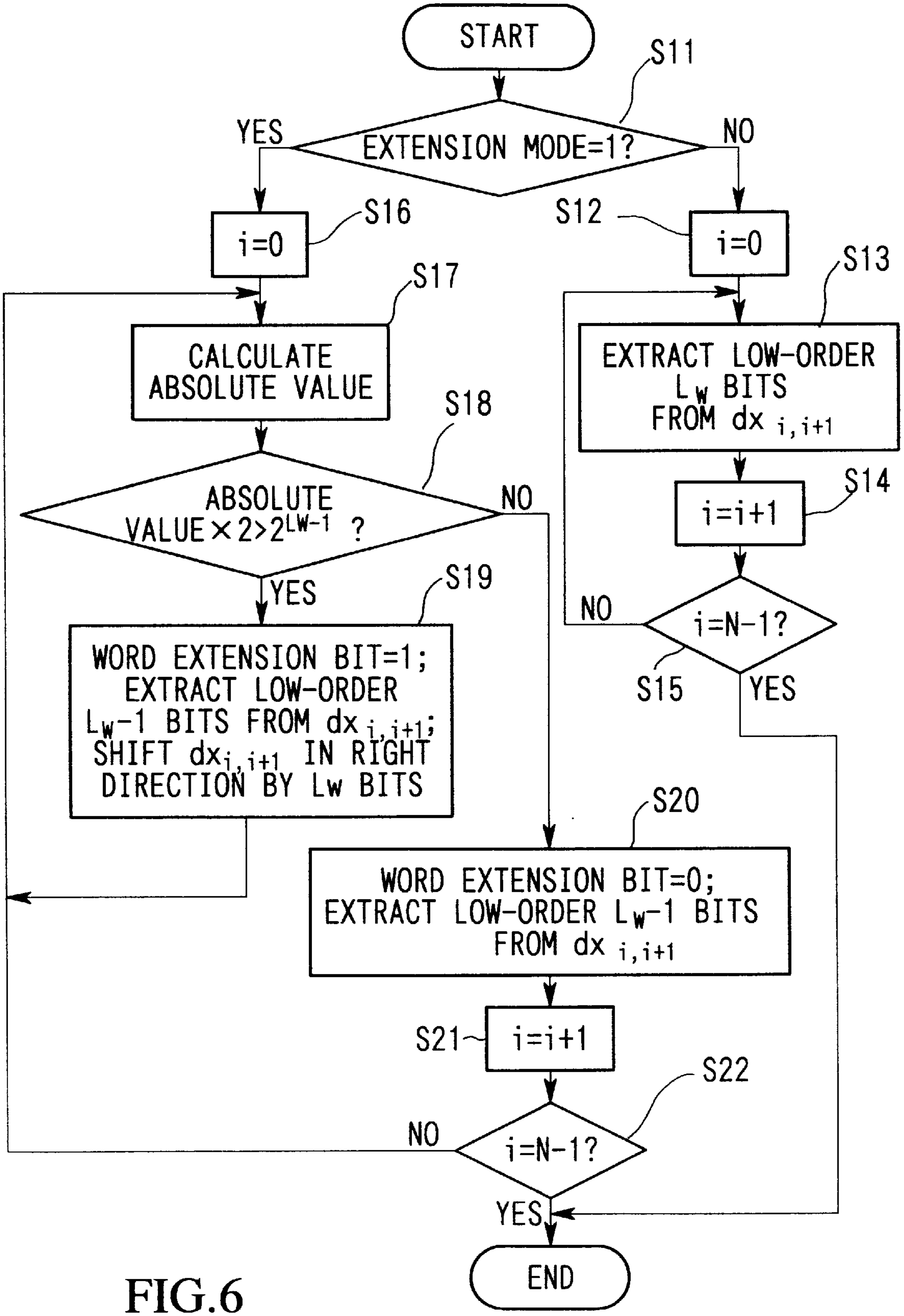
FIG. 6 is a flowchart showing an algorithm of variable quantization processing executed in the compressive encoder.

FIG. 6 is a flowchart showing a content of the variable quantization processing performed by the variable quantization processing section 14 shown in FIG. 1.

When the word extension mode is set at '0'(see step S11), the system proceeds with requantization of the first mode. So, the system repeats a process, consisting of steps S12 to S15, which is provided to extract low-order LW bits (where $L_W$ denotes a number of bits to be extracted) from the difference value data dxi,i+1 with respect to the variable i which is changed from '0' to 'N−1'.

On the other hand, when the word extension mode is set at '1', the system proceeds with requantization of the second mode. So, the system repeats a number of steps S16 to S22 with respect to the variable i which is changed from '0' to 'N−1'. Specifically, the system calculates an absolute value for the difference value data dxi,i+1 in step S17. In step S18, a decision is made as to whether or not the double of the absolute value is greater than a value of $2^{LW-1}$. The reason why the double of the absolute value is used for the decision is to secure a single bit as a sign bit. If the double of the absolute value is greater than the value of $2^{LW-1}$, the system proceeds to step S19 wherein a digit 1 is added as a word extension bit; low-order ($L_W$−1) bits are extracted from the difference value data dxi,i+1; bits of the difference value data dxi,i+1 are shifted in a right direction of binary notation by $L_W$ bits. Thereafter, the aforementioned steps S17 to S19 are repeated. If the system detects in step S18 that the double of the absolute value is not greater than the value of $2^{LW-1}$, the system proceeds to step S20 wherein a digit 0 is added as a word extension bit while low-order ($L_W$−1) bits are extracted from the difference value data dxi,i+1.

By repeating the aforementioned steps of FIG. 6, the variable quantization processing section 14 produces a series of difference value data whose one-frame length is compressed and which are then forwarded to the bit stream generation section 15.

Figure 7:
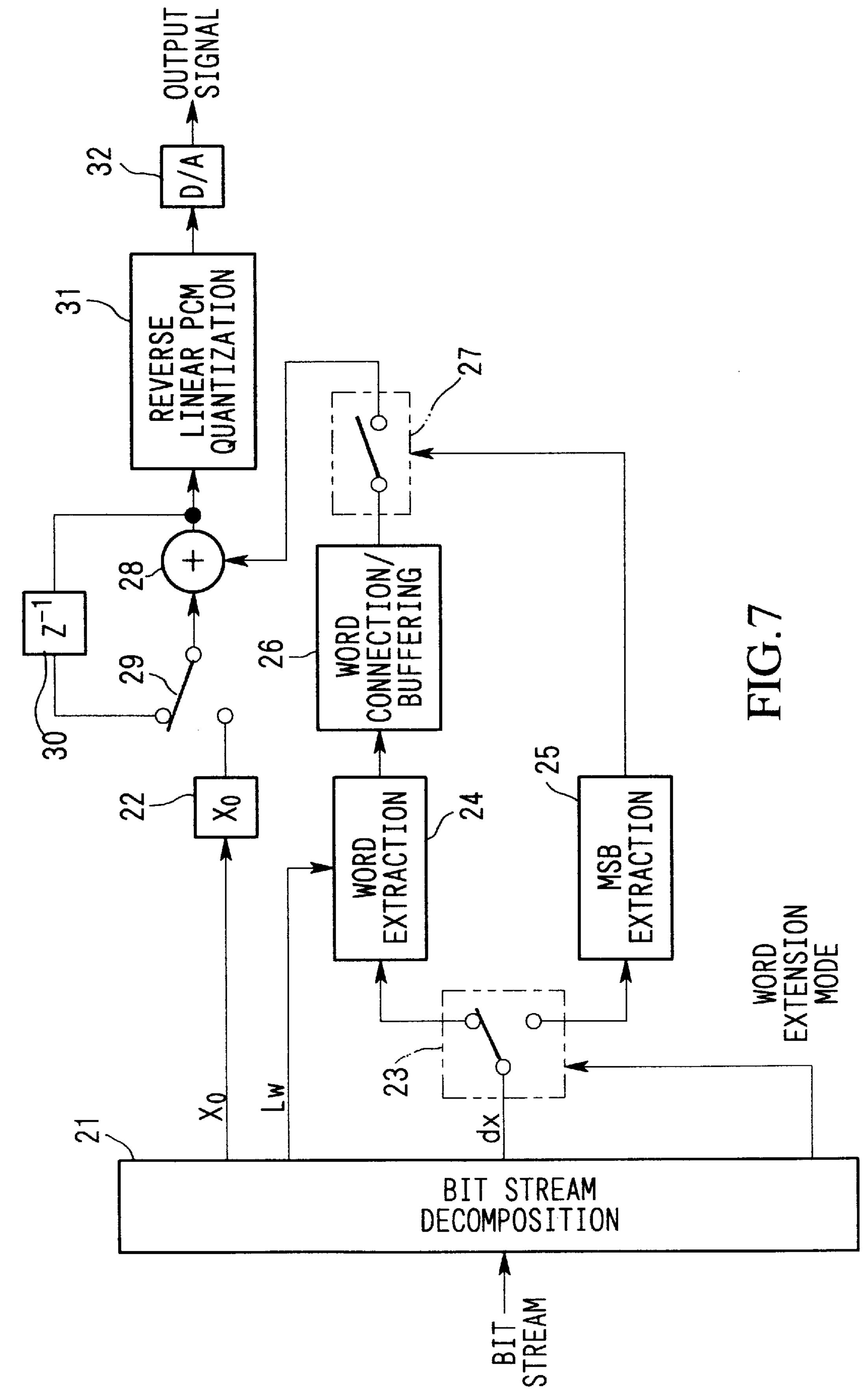
FIG. 7 is a block diagram showing a configuration of a compressive decoder in accordance with the embodiment of the invention.

FIG. 7 is a block diagram showing a configuration of a compressive decoder which reproduces original signals from the bit stream generated by and output from the compressive encoder of FIG. 1.

In FIG. 7, an input bit stream is supplied to a bit stream decomposition section 21 wherein it is decomposed into an initial value x0, a series of difference value data dx, a word length $L_W$ and information of a word extension mode. The initial value x0 is stored in an initial value buffer 22. A series of difference value data dx are forwarded to a word extraction section 24 via a switch 23. So, the difference value data are stored in the word extraction section 24. Herein, the switch 23 is switched over in response to the word extension mode. That is, the difference value data dx are fixedly supplied to the word extraction section 24 when the word extension mode is '0', whereas when the word extension mode is '1', only a most significant bit (MSB) of each difference value data is supplied to a MSB extraction section 25. The word extraction section 24 performs word extraction of the difference value data by every word length $L_W$, so words of data sequentially extracted are supplied to a word connection/buffering section 26. An output of the word connection/buffering section 26 is supplied to an adder 28 via a switch 27 by each word when the word extension mode is '0'. Under the condition where the word extension mode is '1', a value of the MSB extracted by the MSB extraction section 25 is supplied to the adder 28 via the switch 27 which is turned ON only when the MSB is zero. Thus, the word connection/buffering section 26 performs word connection to produce an accumulative addition value of the difference value data.

At a top of the frame, the adder 28 outputs the initial value x0 which is supplied thereto via a switch 29. Thereafter, the adder 28 calculates the accumulative addition value of the difference value data while accumulating it in a latch circuit 30. As a result of the accumulative addition, the adder 28 reproduces linear PCM data. Then, the linear PCM data are subjected to reverse quantization of a reverse linear PCM quantization section 31, an output of which is then subjected to digital-to-analog conversion by a D/A converter 32. Thus, it is possible to provide an output signal which is a reproduced equivalence of the input data input to the aforementioned compressive encoder.

According to the compressive encoding-decoding system of the present embodiment, an optimum requantization mode and an optimum word length are determined for difference value data by a unit of frame. So, it is possible to actualize lossless compressive encoding of high efficiency which responds to states of input signals.

In addition, the present embodiment is designed such that each frame contains an initial value, so it is possible to perform a frame skip process that skips words of (N−1) samples in readings on the basis of the word length $L_W$ and word extension flag. Herein, it is not necessary to perform a decoding process in the middle of the execution of the frame skip process. As a result, it is possible to simplify processing for reproduction, so it is possible to improve a processing speed. For this reason, the present system is useful for high-speed search on a recording medium storing music information and the like.

Incidentally, the scope of the invention is not limited to the present embodiment described heretofore. In addition, the present embodiment can be modified in a variety of ways.

For example, FIG. 8 shows a modified example of a bit stream generated by the compressive encoder. As compared with the bit stream of FIG. 3A in which an initial value is contained in each frame, the bit stream of FIG. 8 is constructed in such a way that an initial value is located at a top of the bit stream prior to the frame. In this case, difference value data located at a top of one frame corresponds to a difference value relating to last PCM data of a previous frame. For this reason, each frame contains multiple difference value data, a number of which should be 'N'. Herein, instead of the initial value which is data of a full-bit form, difference value data is located at the top of the frame. Therefore, as compared with the foregoing construction of the bit stream shown in FIG. 3A, the construction of the bit stream of FIG. 8 has a higher effect of compression.

The modified example of the embodiment described above is designed such that data of frames continue without breaks. In order to search a frame boundary, it is necessary to perform the reading skip process and decoding process from the top of the data.

Improvements to the above can be given by special formats for blocks of the bit stream shown in FIGS. 9A and 9B.

The format of FIG. 9A is constructed in such a way that one frame is constructed by multiple data blocks. A construction of each data block is equivalent to a construction of the frame shown in FIG. 8. That is, each data block contains the word length $L_W$, information of the word extension mode and the difference value data. To provide separation of one frame at a byte boundary, remaining bits are subjected to padding by zero data. Further, a frame header is located at a top (or head) of the frame. The frame header stores frame length information (corresponding to the unit of byte) and the initial value x0.

By providing a separation of the frame at a byte boundary while providing frame length information at a top of the frame, the system is capable of performing frame skipping very easily.

The applicability of this invention can be extended in a variety of ways. For example, programs and data of the present embodiment can be stored in storage media such as CD-ROMs, magneto-optics disks, floppy disks and hard disks. Further, the compressive encoding-decoding system of the present embodiment can be linked with the server computer (or host computer) via communications lines such as the local area networks (i.e., LAN), computer network (e.g., Internet) and telephone lines. So, the programs and data can be down-loaded to the system from the computer via the communication lines.

For example, the storage media store a compressive encoding program which contains three steps as follows:

(1) A first step to generate a series of PCM data based on input signals which are input to a compressive encoder.

(2) A second step to generate a series of difference value data each representing a difference between adjacent samples of a series of PCM data.

(3) A third step wherein a series of difference value data are combined with respect to each frame; a word length is determined to coincide with a minimum number of bits which are required to represent the difference value data having a maximum absolute value within the difference value data contained in each frame; all the difference value data contained in each frame are subjected to requantization using the word length; then, data of each frame is produced to contain the difference value data requantized as well as information of the word length.

Lastly, this invention is capable of providing a variety of merits (or effects), some of which can be described as follows:

(1) According to one aspect of this invention, the word length is determined to coincide with a number of bits which are capable of representing the "maximum" difference value data contained in each frame. So, a relatively long word length is determined for the frame in which amplitude of the difference value data is relatively large, while a relatively short word length is determined for the frame in which amplitude of the difference value data is relatively small. For this reason, it is possible to assign an optimum word length to each frame. Thus, it is possible to actualize the complete lossless encoding while avoiding useless bits to be assigned to each frame.

(2) According to another aspect of this invention, a value of 'L' is determined as a unit of bits for partitioning in such a way that an overall length of each frame becomes the shortest when each of the difference value data contained in each frame is subjected to partitioning by every L bits. In addition, a single bit representing as to whether or not each portion of L bits within each difference data which is partitioned into a plurality of portions each corresponding to L bits is a last portion (or last word) in each difference value data is added as a flag to the word length. For this reason, even if the difference value data of one frame contain "very large" difference value data, it is possible to perform encoding using a small number of bits with respect to other difference value data which are relatively small. So, it is possible to perform an encoding process having a good efficiency as a whole.

(3) According to a further aspect of this invention, there are provided first and second modes, each of which is provided for determination of an optimum word length. Herein, it is possible to select one of the first and second modes which provides a shorter length for the frame. So, the first mode is selected under the condition where all of the difference value data contained in the frame are almost the same in levels. The second mode is selected if a part of the difference value data contained in the frame is very large in level as compared to other difference value data. Thus, by adequately selecting an optimum mode for the frame, it is possible to perform an encoding process whose efficiency is further improved.

(4) Furthermore, each frame contains an initial value corresponding to the PCM data which is located at a top of a series of PCM data corresponding to each frame. Using such an initial value, it is possible to regenerate original PCM data by each frame in the compressive decoder. In addition, it is possible to skip some frames without decoding so as to engage selective reproduction of the PCM data. As a result, it is possible to speed up the processing of this invention.

(5) Moreover, the initial value corresponding to the PCM data is not always required to be added to each frame.

For example, the initial value is set with respect to the PCM data of multiple frames and is added to a set of the multiple frames. In this case, the decoding is required while skipping the frames. However, it is possible to further reduce an overall length with respect to each of the frames.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within metes and bounds of the claims, or equivalence of such metes and bounds are therefore intended to be embraced by the claims.

What is claimed is:

1. A compressive encoding system comprising:

PCM quantization means for generating a series of PCM data based on input signals;

difference value generating means for calculating difference values between adjacent samples of the series of PCM data so as to generate a series of difference value data; and requantization means for combining the series of difference value data with respect to each frame, wherein a minimum number of bits which are required to represent a maximum absolute value within absolute values of the difference value data contained in each frame is detected as a word length, so that requantization is performed on all the difference value data contained in each frame on the basis of the word length, thus the requantization means producing data of each frame containing the difference value data requantized as well as information of the word length.

2. A compressive encoding system according claim 1 wherein the requantization means uses a value of the PCM data which is located at a top of the series of PCM data corresponding to each frame as an initial value, which is added to each frame to produce the data of each frame.

3. A compressive encoding system according claim 1 wherein the requantization means uses a value of the PCM data which is located at a top of the series of PCM data corresponding to consecutive frames as an initial value, which is added to the consecutive frames to produce data of the consecutive frames.

4. A compressive encoding system comprising:

PCM quantization means for generating a series of PCM data based on input signals;

difference value generating means for calculating difference values between adjacent samples of the series of PCM data so as to generate a series of difference value data; and requantization means for combining the series of difference value data with respect to each frame, wherein a value of 'L' is determined as a unit of bits for partitioning in such a way that an overall length of each frame becomes the shortest when each of the difference value data contained in each frame is subjected to partitioning starting from a least significant bit thereof by every L bits so that requantization is performed using the unit of bits corresponding to L bits, and wherein a single bit representing as to whether or not each portion of L bits within each difference value data which is partitioned into a plurality of portions each corresponding to L bits is a last portion in each difference value data is added as a flag to the word length, thus the requantization means producing data of each frame containing the difference value data requantized based on the word length as well as information of the word length.

5. A compressive encoding system comprising:

PCM quantization means for generating a series of PCM data based on input signals;

difference value generating means for calculating difference values between adjacent samples of the series of PCM data so as to generate a series of difference value data; and requantization means for combining the series of difference value data with respect to each frame and for determining a word length for the difference value data contained in each frame so as to produce data of each frame containing the difference value data requantize based on the word length as well as information of the word length, said requantization means determining the word length in accordance with either a first mode or second mode, wherein in the first mode, determination of the word length is made in such a way that a minimum number of bits which are required to represent the difference value data having a maximum absolute value within the difference value data contained in each frame is determined as the word length, while in the second mode, a value of 'L' is determined as a unit of bits for partitioning in such a way that an overall length of each frame becomes the shortest when each of the difference value data contained in each frame is subjected to partitioning starting from a least significant bit thereof by every L bits so that requantization is performed using the unit of bits corresponding to L bits, and wherein a single bit representing as to whether or not each portion of L bits within each difference value data which is partitioned into a plurality of portions each corresponding to L bits is a last portion in each difference value data is added as a flag to the word length in the second mode, wherein the requantization means selects one of the first and second modes which provides a smaller number of bits for each frame, so that the requantization means produces data of each frame containing the difference value data requantized using the word length determined based on the selected mode as well as information of the selected mode.

6. A compressive decoding system comprising:

decomposition means for receiving data of each frame to decompose it into a series of difference value data each corresponding to a difference between adjacent samples within a series of PCM data, an initial value corresponding to the PCM data and information of a word length which is used for the difference value data, the decomposition means also extracting the difference value data on the basis of the information of the word length; and PCM data reproducing means for performing accumulative addition, starting from the initial value, to sequentially accumulate the difference value data extracted by the decomposition means, thus reproducing the PCM data.

7. A compressive decoding system according to claim 6 wherein each difference value data is represented by one or more words each corresponding to a unit of the word length, so that each difference value data contains a flag representing as to whether or not each word is a last word within each difference value data, and wherein the PCM data reproducing means combines words based on the flag of each word to reproduce each difference value data.

8. A machine-readable media storing a program which causes a compressive encoding system to perform a compressive encoding method comprising the steps of:

generating a series of PCM data on the basis of input signals;

generating a series of difference value data each representing a difference between adjacent samples of the series of PCM data; and combining the series of difference value data with respect to each frame;

determining a minimum number of bits required for representing the difference value data having a maximum absolute value within the difference value data contained in each frame as a word length;

requantizing all the difference value data contained in each frame on the basis of the word length; and producing data of each frame containing the difference value data requantized as well as information of the word length.

9. A compressive encoding-decoding system comprising:

a compressive encoder for generating a bit stream based on input signals, wherein the bit stream is configured by information of a word length, information of a word extension mode and a series of difference value data, each representing a difference between adjacent samples of linear PCM data which are generated by performing linear PCM quantization of the input signals; and a compressive decoder for decoding the bit stream into the series of difference value data on the basis of the word length and the word extension mode, wherein the difference value data are subjected to reverse linear PCM quantization to reproduce the linear PCM data.

10. A compressive encoding-decoding system according to claim 9 wherein the word length is determined in different ways corresponding to first and second modes in such a way that in the first mode where the word extension mode is OFF, a minimum number of bits for representing the difference value data having a maximum absolute value within the series of difference value data with respect to each frame is used as the word length, while in the second mode where the word extension mode is ON, a value of 'L' is determined as a unit of bits for partitioning in such a way that an overall length of each frame becomes the shortest when each of the difference value data contained in each frame is subjected to partitioning starting from a least significant bit thereof by every L bits so that requantization is performed using the unit of bits corresponding to the L bits, and wherein a single bit representing as to whether or not each portion of L bits within each difference value data which is partitioned into a plurality of portions each corresponding to L bits is a last portion in each difference value data is added as a flag to the word length.

11. A compressive encoding method comprising the steps of:

performing analog-to-digital conversion of input signals in accordance with a non-linear quantization method to produce digital data;

converting the digital data to a series of linear PCM data;

generating a series of difference value data each representing a difference between adjacent samples of the series of linear PCM data;

detecting an absolute value for each of the series of difference value data;

determining a word length to coincide with a minimum number of bits which are required to represent the difference value data having a maximum absolute value within the series of difference value data with respect to each frame;

performing requantization on the series of difference value data on the basis of the word length; and generating a bit stream containing the series of difference value data requantized and information of the word length with respect to each frame.

12. A compressive encoding method comprising the steps of:

performing analog-to-digital conversion of input signals in accordance with a non-linear quantization method to produce digital data;

converting the digital data to a series of linear PCM data;

generating a series of difference value data each representing a difference between adjacent samples of the series of linear PCM data;

detecting an absolute value for each of the series of difference value data;

determining a value of 'L' as a unit of bits for partitioning in such a way that an overall length of each frame becomes the shortest when each of the difference value data contained in each frame is subjected to partitioning starting from a least significant bit thereof by every L bits;

adding a single bit representing as to whether or not each portion of L bits within each difference value data which is partitioned into a plurality of portions each corresponding to L bits is a last portion in each difference value data as a flag to the unit of L bits so as to set a word length;

performing requantization on the series of difference value data on the basis of the word length; and generating a bit stream containing the series of difference value data requantized and information of the word length with respect to each frame.

13. A compressive encoding method according to claim 11 wherein the non-linear quantization method corresponds to $\mu$-law method or A-law method.

* * * * *